United States Patent
Cho et al.

(10) Patent No.: US 6,784,062 B2
(45) Date of Patent: Aug. 31, 2004

(54) TRANSISTOR FORMATION FOR SEMICONDUCTOR DEVICES

(75) Inventors: Chih-Chen Cho, Boise, ID (US); Zhongze Wang, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/162,289

(22) Filed: Jun. 3, 2002

(65) Prior Publication Data

US 2003/0224574 A1 Dec. 4, 2003

(51) Int. Cl.$^7$ ............................................. H01L 21/8238
(52) U.S. Cl. ....................... 438/302; 438/199; 438/275; 438/299
(58) Field of Search ................................. 438/199, 228, 438/224, 229, 232, 275

(56) References Cited

U.S. PATENT DOCUMENTS

| | | | |
|---|---|---|---|
| 5,094,712 A | * 3/1992 | Becker et al. | 438/721 |
| 6,110,782 A | * 8/2000 | Chu et al. | 438/275 |
| 6,136,211 A | * 10/2000 | Qian et al. | 438/710 |
| 6,232,162 B1 | * 5/2001 | Kao | 438/199 |
| 6,461,908 B2 | * 10/2002 | Stolk et al. | 438/228 |
| 2001/0046740 A1 | * 11/2001 | Kim et al. | 438/275 |

OTHER PUBLICATIONS

K. Kasai et al. W/WN/Poly–Si Gate Technology for Future High Speed Deep Submicron CMOS LSIs. IEDM 1994, pp. 497–500.*
R. Malik et al. W/WN?Poly Gate Implementation for Sub–130 nm Vertical Cell DRAM. Symposium on VLSI Technology Dig. of Technical Papers 2001, pp. 31–32.*
S. Wol. et al. Silicon Processing for the VLSI Era, vol. 1, pp. 557–558, vol. 3, pp. 309–311.*

* cited by examiner

*Primary Examiner*—Long Pham
*Assistant Examiner*—Anh D. Mai

(57) ABSTRACT

A semiconductor fabrication method of forming a pair of transistor gates of opposite conductivity type by partially forming first and second gate stacks comprising an insulation layer, a conductive layer and polysilicon layer for the pair of transistor by removing a portion of the polysilicon layer. The polysilicon layer includes a dominant region of first-type conductive dopants and a dominant region of second-type conductive dopants. A first-type conductive transistor gate is formed by, completing the formation of the first gate stack and a second-type conductive transistor gate is formed by completing the formation of the second gate stack separately from the formation of the first-type transistor gate.

19 Claims, 3 Drawing Sheets

TRANSISTOR FORMATION FOR SEMICONDUCTOR DEVICES

FIELD OF THE INVENTION

This invention relates to a semiconductor device and fabrication thereof and, more particularly, to transistor formation in a semiconductor device and fabrication thereof.

BACKGROUND OF THE INVENTION

Semiconductor devices, including logic devices, embedded memory devices and memory devices, utilize Field Effect Transistors (FETs), which may use both N+ and P+ doped polysilicon gates. However, using both types of transistor gates in the same device creates challenges in the fabrication process. Many memory devices utilize both N+ and P+ polysilicon gates and thus exhibit fabrication issues that require attention to obtain quality devices at the lowest production price possible.

For example, during Static Random Access Memory (SRAM) fabrication, when both N+ and P+ polycrystalline silicon (or germanium) are used as the transistor gate electrodes (known in the art as wordline gate electrodes), it is difficult to form good wordline etch profiles for both N-channel and P-channel transistors without pitting the silicon substrate, due to the different etching characteristics of a P-type doped polysilicon versus an N-type doped polysilicon.

The difficulty increases when thinner gate oxide is used fabricate smaller geometric devices. Furthermore, if a Self Aligned Contact (SAC) etch is desired to open access to the source/drain areas of the transistor, it requires a tall wordline stack with an oxide/nitride cap deposited on top of the wordline gate electrodes. The taller wordline stack used for a process flow with SAC etch makes it more difficult to etch than process flows that use a salicide process due to the higher aspect ratio during the etch process. For example, the SAC etch has to etch through the entire gate stack comprising an oxide (or nitride) cap, a $WSi_x$ (or W) layer and a polysilicon layer. On the other hand a silicide process needs to only etch through a polysilicon layer.

The present invention comprises a method to form transistors with highly desirable transistor gate profiles.

SUMMARY OF THE INVENTION

A significant focus of an exemplary implementation of the present invention includes a method of forming transistors, such as p-channel and n-channel devices, during v semiconductor fabrication.

An exemplary implementation of the present invention comprises a semiconductor fabrication method of forming a pair of transistor gates of opposite conductivity type by partially forming first and second gate stacks comprising an insulation layer, a conductive layer and polysilicon layer for the pair of transistor by removing a portion of the polysilicon layer. The polysilicon layer includes a dominant region of first-type conductive dopants and a dominant region of second-type conductive dopants. A first-type conductive transistor gate is formed by, completing the formation of the first gate stack and a second-type conductive transistor gate is formed by completing the formation of the second gate stack separately from the formation of the first-type transistor gate.

DETAILED DESCRIPTION OF THE INVENTION

Figure 1:
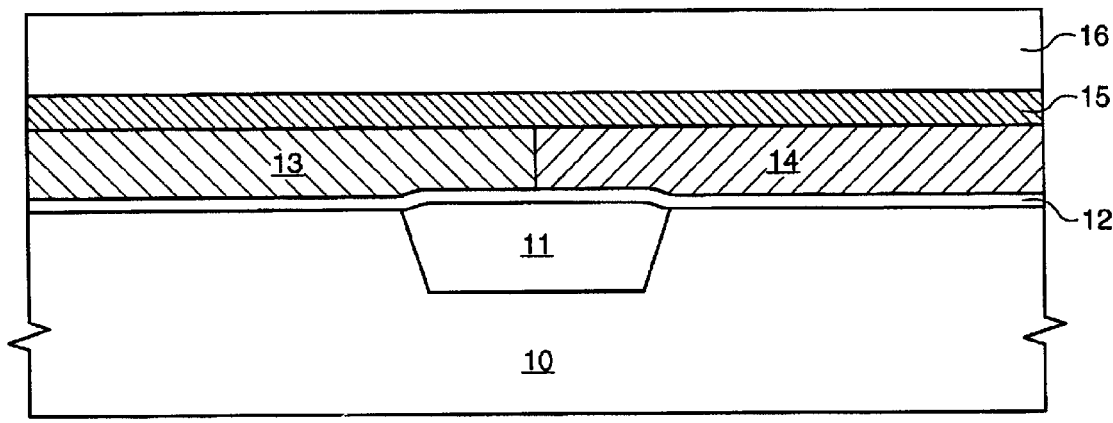
FIG. 1 is a cross-sectional view of a semiconductor substrate section showing an overlying gate oxide layer, a conductively doped polysilicon layer, a tungsten silicide layer and an oxide capping layer.

FIG. 1 depicts a conventionally processed semiconductor assembly prior to implementation of the present invention. FIGS. 2–6 depict an exemplary implementation of the present invention that is directed to a method to form transistor pairs for use in semiconductor devices.

In conventional processing flows used to form a transistor gate and the transistor's source/drain regions, a gate oxide is deposited, followed by the deposition of a polysilicon layer. Next, the polysilicon layer is patterned using photolithography, to allow the implanting of n-type conductive dopants to form N+ polysilicon. Next, the polysilicon layer is patterned using photolithography, to allow the implanting of p-type conductive dopants to form P+ polysilicon. Next, a conductive layer, such as $WSi_x$ or WN/W is deposited to complete a stack of material that will be patterned and etched together with the N+ polysilicon and P+ polysilicon to form an N+ polysilicon gate and a P+ polysilicon gate. The etch will stop in the gate oxide layer.

Prior to the patterning and etching of the N+ and P+ polysilicon gates the present invention departs from conventional processing flows and includes a new process sequence that greatly improves the quality of the resulting N-channel and P-channel transistors.

The following exemplary implementation is in reference to a fabrication of transistor pairs for use in a semiconductor assembly. While the concepts of the present invention are conducive to the fabrication of transistor pairs for a Static Random Access Memory (SRAM) device, the concepts taught herein may be applied to other semiconductor devices, such as Dynamic Random Access Memories (DRAMs), logic devices and embedded memory devices, that would likewise benefit from the use of the transistor pair fabrication process disclosed herein. Therefore, the depictions of the present invention in reference to SRAM transistor pair formation are not meant to so limit the extent to which one skilled in the art might apply the concepts taught hereinafter.

Using methods know to those skilled in the art and referring now to FIG. 1, a gate oxide layer 11 has been formed on substrate 10, such as a silicon substrate, over which a conductively doped polysilicon layer, comprising N+ polysilicon section 13 and P+ polysilicon section 14 has been formed. Conductive layer 15, such as tungsten silicide ($WSi_x$), tungsten nitride (WN) or tungsten (W) has been formed over N+ polysilicon section 13 and P+ polysilicon section 14, over which, capping layer 16, such as oxide or nitride, has been formed.

Figure 2:
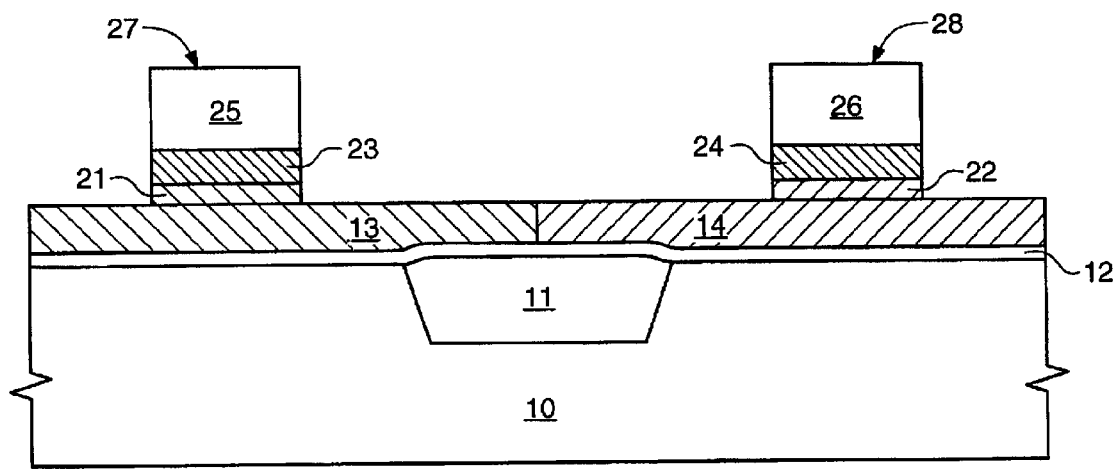
FIG. 2 is a subsequent cross-sectional view taken from FIG. 1 following the a partial etch to form a pair of partial wordline stacks, each partial stack comprising an oxide cap, a tungsten silicide intermediate layer and conductively doped polysilicon.

Referring now to FIG. 2, an etch step, such as an insitu dry etch, is preformed to pattern and partially form a wordline pair comprising N+ polysilicon wordline 27 and P+ polysilicon wordline 28. As an example, during this partial etch wordline stack 27, comprising oxide cap 25, $WSi_x$ 23 and N+ polysilicon 21 and wordline stack 28, comprising oxide cap 26, $WSi_x$ 24 and N+ polysilicon 22, are formed. This etch step is a partial etch in that only a portion of N+ polysilicon section 13 and a portion of P+ polysilicon section 14 are removed to form N+ polysilicon structure 21 and P+ polysilicon structure 22, respectively. Performing this partial etch is an important step to the process method of the present invention that will become evident in the subsequent step.

Typically, $WSi_x$ is etched by $Cl_2$ and $CF_4$, while WN and W are etched by $NF_3$ and $Cl_2$. The etch is timed such that it will stop after partial sections of polysilicon section 13 and polysilicon section 14 are removed. A $WSi_x$ etch (or a W/WN etch) can end point easily; thus, a requirement of the present invention is for a complete removal of the $WSi_x$ (or W/WN) and partially etching into the polysilicon layers 13 and 14.

Figure 3:
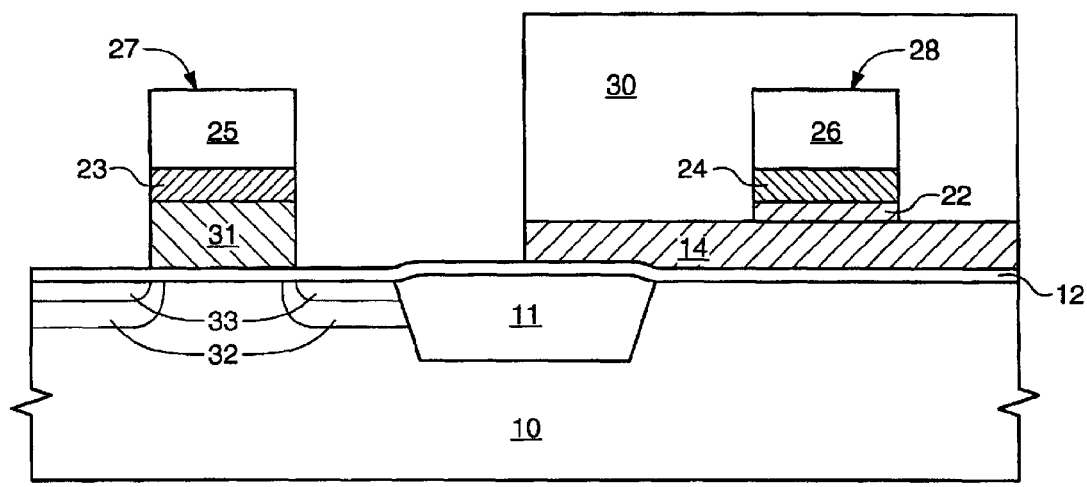
FIG. 3 is a subsequent cross-sectional view taken from FIG. 2 following an N+ polysilicon etch followed by a Halo/source-drain extension implant.

Referring now to FIG. 3, photoresist mask 30 is patterned to cover P+ polysilicon 14 and to encompass and cover wordline stack 28, prior to a subsequent etch step. Next, an N+ polysilicon etch is performed to remove exposed N+ polysilicon 13 to complete the profile of wordline stack 27, comprising oxide cap 25, $WSi_x$ 23 and N+ polysilicon 31. The N+ polysilicon etch is selective to polysilicon and will therefore stop on oxide cap 25 and gate oxide 12. An example of a chemistry, which may be used to etch the N+ polysilicon but not the oxide, is HBr, $Cl_2$ and $O_2$.

The N+ polysilicon etch is followed by a halo implant, such as an angled halo implant using boron impurities, such as Boron ($B_{11}$), to form doped p-type halo regions 32. Next, a Source/Drain Extension (SDE) implant step is performed, such as a Lightly Doped Drain (LDD) implant step using arsenic (As) impurities, to create lightly doped drain regions 33. Conventional fabrication steps to form the final source/drain regions are performed to complete the formation of an n-channel transistor.

For example, the halo implant may be performed by implanting the substrate with 30 keV boron ions to a dose of 2e12 ions/$cm^2$ at a tilt angle of 25° from four directions with a 90° rotation angle (or X4), while the SDE implant may be performed by implanting the substrate with 15 keV arsenic ions to a dose of 5e13 ions/$cm^2$ at an angle of 25° X4.

Figure 4:
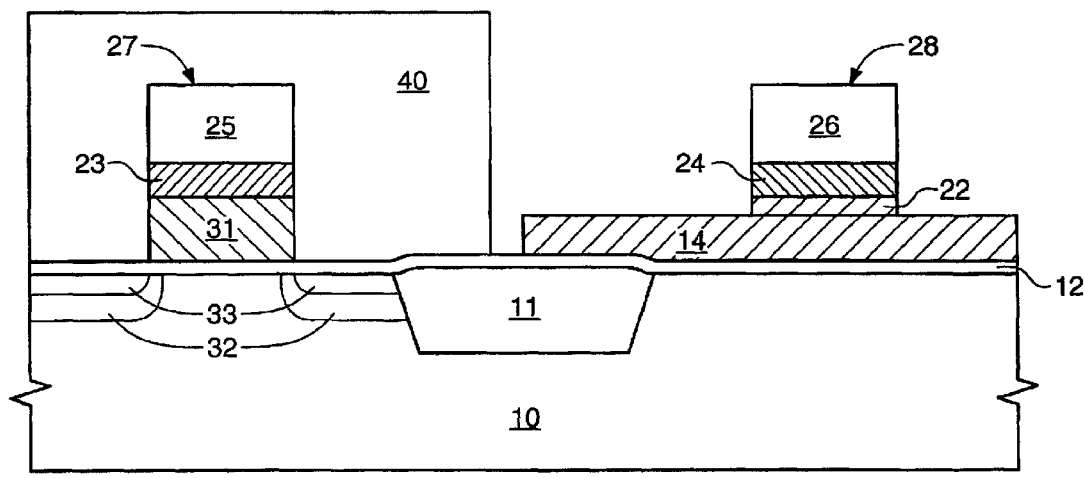
FIG. 4 is a subsequent cross-sectional view taken from FIG. 3 following a P-channel Halo photo.

Referring now to FIG. 4, photoresist mask 40 is patterned to cover wordline stack 27, prior to a subsequent etch step. It is desirable that photoresist mask 40 under-laps P+ polysilicon 14 such that the entire substantially vertical edge of P+ polysilicon 14 is exposed to the above mentioned etch step so that no polysilicon material remains at the N+ poly/P+ poly interface.

Figure 5:
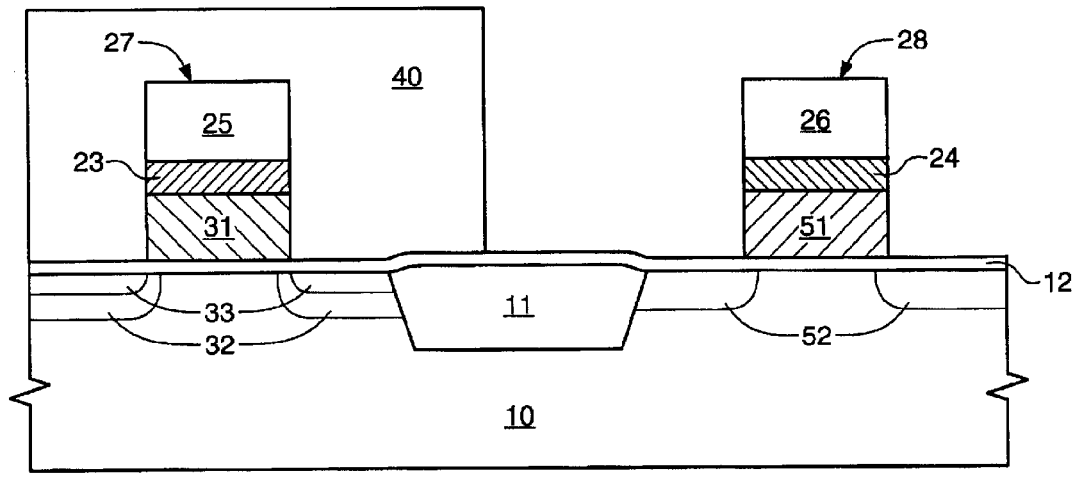
FIG. 5 is a subsequent cross-sectional view taken from FIG. 4 after a P+ polysilicon etch followed by a P-channel Halo implant.

Referring now to FIG. 5, a P+ polysilicon etch is performed to remove exposed P+ polysilicon 14 and to complete the profile of wordline stack 28, comprising oxide cap 26, $WSi_x$ 24 and P+ polysilicon 50. The P+ polysilicon etch is selective to polysilicon and will therefore stop on oxide cap 26 and gate oxide 12. An example of a chemistry, which may be used to etch the P+ polysilicon but not the oxide, is HBr, $Cl_2$ and $O_2$.

Following the P+ polysilicon etch step, a halo implant, such as an angled phosphorus halo implant, is performed to form n-type halo regions 52. Conventional fabrication steps to form the final source/drain regions are performed to complete the formation of a p-channel transistor. The implant may be performed by implanting the substrate with 80 keV phosphorous ions to a dose of 2e12 ions/$cm^2$ at an angle of 25° X4.

Figure 6:
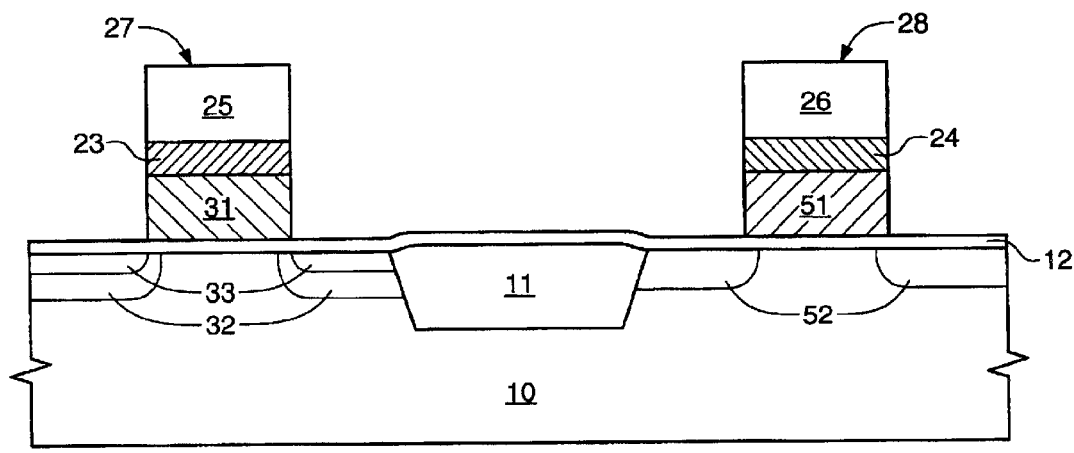
FIG. 6 is a subsequent cross-sectional view taken from FIG. 5 after the photoresist is removed.

Referring now to FIG. 6, a final etch step is performed to remove photoresist mask 40. Fabrication methods known to those skilled in the art are then used to complete the processing of the memory device. The fabrication method used to form the wordline pair may be used in numerous semiconductor applications and particularly in, but not limited to, SRAMs. For example, this fabrication method may also be implemented to fabricate transistor gate electrodes (i.e., gate polysilicon) in other semiconductor devices, such as logic devices and embedded memory devices.

It is to be understood that, although the present invention has been described with reference to a preferred embodiment, various modifications, known to those skilled in the art, may be made to the disclosed structure and process herein without departing from the invention as recited in the several claims appended hereto.

What is claimed is:

1. A method of forming a pair of transistor gates of opposite conductivity type during semiconductor fabrication comprising the steps of:

forming transistor gate stack layers comprising a polysilicon layer having first and second lateral sections, the first lateral section having a dominant first-type conductive dopant therein, the second lateral section having a dominant second-type conductive dopant therein;

etching the gate stack material and an upper portion of the polysilicon layer to form a first partial gate stack comprising an upper portion of the first lateral section and a second partial gate stack comprising an upper portion of the second lateral section, after the etching, a lower portion of the polysilicon layer remains to form a first lateral section extension beyond the first partial gate stack and a second lateral section extension beyond the second partial gate stack;

forming a first mask that covers the partial second gate stack and the second lateral section extension and exposes the partial first gate stack and the first lateral section extension;

with the first mask present, forming a first-type conductive transistor gate by removing the exposed first lateral section extension;

forming a second mask that covers the first-type conductive transistor gate and exposes the partial second gate stack and the second lateral section extension exposed;

with the second mask present, forming a second-type conductive transistor gate by removing the exposed second lateral section extension.

2. The method of claim 1, wherein said etching the gate stack material and an upper portion of the polysilicon layer comprises a timed etch that is selective to polysilicon material.

3. A method of forming a pair of transistor gates of n-type and p-type conductivity during semiconductor fabrication comprising the steps of:

forming transistor gate stack layers comprising a polysilicon layer having first and second lateral sections, the first lateral section having a dominant N+ type conductive dopant therein, the second lateral section having a dominant P+ type conductive dopant therein;

etching the gate stack material and an upper portion of the polysilicon layer to form a first partial gate stack comprising an upper portion of the first lateral section and a second partial gate stack comprising an upper portion of the second lateral section, after the etching, a lower portion of the polysilicon layer remains to form a first lateral section extension beyond the first partial gate stack and a second lateral section extension beyond the second partial gate stack;

forming a first mask that covers the partial second gate stack and the second lateral section extension and exposes the partial first gate stack and the first lateral section extension;

with the first mask present, forming an N+ type conductive transistor gate by removing the exposed first lateral section extension;

forming a second mask that covers the first-type conductive transistor gate and exposes the partial second gate stack and the second lateral section extension exposed;

with the second mask present, forming a P+ type conductive transistor gate by removing the exposed second lateral section extension.

4. The method of claim 3, wherein said etching the gate stack material and an upper portion of the polysilicon layer comprises a timed etch that is selective to polysilicon material.

5. A method of forming a pair of transistors of opposite conductivity type during semiconductor fabrication comprising the steps of:

forming transistor gate stack layers comprising a polysilicon layer having first and second lateral sections, the first lateral section having a dominant first-type conductive dopant therein, the second lateral section having a dominant second-type conductive dopant therein;

etching the gate stack material and an upper portion of the polysilicon layer to form a first partial gate stack comprising an upper portion of the first lateral section and a second partial gate stack comprising an upper portion of the second lateral section, after the etching, a lower portion of the polysilicon layer remains to form a first lateral section extension beyond the first partial gate stack and a second lateral section extension beyond the second partial gate stack;

forming a first mask that covers the partial second gate stack and the second lateral section extension and exposes the partial first gate stack and the first lateral section extension;

with the first mask present, forming a first-type conductive transistor by removing the exposed first lateral section extension followed by forming source/drain regions dominated with the first-type conductive dopants;

forming a second mask that covers the first-type conductive transistor and exposes the partial second gate stack and the second lateral section extension exposed;

with the second mask present, forming a second-type conductive transistor by removing the exposed second lateral section extension followed by forming source/drain regions dominated with said second-type conductive dopants.

6. The method of claim 5, wherein said etching the gate stack material and an upper portion of the polysilicon layer comprises a timed etch that is selective to polysilicon material.

7. A method of forming a pair of complementary transistors during semiconductor fabrication of a memory device comprising the steps of:

forming gate stack material comprising a gate oxide layer overlying a silicon substrate and a gate isolation region, a polysilicon layer overlying said gate oxide layer, the polysilicon layer having first and second lateral sections, the first lateral section having a dominant region of N+ type conductive dopants and the second lateral section having a dominant region of P+ type conductive dopants, a gate conductive layer overlying the polysilicon layer and a gate insulating layer overlying the gate conductive layer;

etching the gate stack material and an upper portion of the polysilicon layer to form a first partial gate stack comprising an upper portion of the first lateral section and a second partial gate stack comprising an upper portion of the second lateral section, after the etching, a lower portion of the polysilicon layer remains to form a first lateral section extension beyond the first partial gate stack and a second lateral section extension beyond the second partial gate stack;

forming a first mask that covers the partial second gate stack and the second lateral section extension and exposes the partial first gate stack and the first lateral section extension;

with the first mask present, forming an N+ type conductive transistor by removing the exposed first lateral section extension followed by forming source/drain regions dominated with the N+ type conductive dopants;

forming a second mask that covers the N+ type conductive transistor and exposes the partial second gate stack and the second lateral section extension exposed;

with the second mask present, forming a P+ type conductive transistor by removing the exposed second lateral section extension followed by forming source/drain regions dominated with the P+ type conductive dopants.

8. The method of claim 7, wherein said etching the gate stack material and an upper portion of the polysilicon layer comprises a timed etch that is selective to polysilicon material.

9. A method of forming complementary transistors during semiconductor fabrication of a memory device comprising the steps of:

performing an insitu dry etch of a P+ polysilicon layer and an N+ polysilicon layer to pattern and partially form a wordline pair comprising a partial N+ polysilicon wordline and a partial P+ polysilicon wordline by etching into but not through said P+ polysilicon layer and said N+ polysilicon layer such that a portion of said P+ polysilicon layer remains that extends beyond the partial P+ polysilicon wordline and a portion of the N+ polysilicon layer remains that extends beyond the partial N+ polysilicon wordline, said partial N+ polysilicon wordline further comprising a first tungsten material and a first oxide material and said partial P+ polysilicon wordline further comprising a second tungsten material and a second oxide material;

masking said portion of said P+ polysilicon layer and said partial P+ polysilicon wordline and exposing said portion of said N+ polysilicon layer and said partial N+ polysilicon wordline;

etching said exposed portion of said N+ polysilicon layer to form a complete N+ polysilicon wordline comprising said N+ polysilicon layer, said first tungsten material and said first oxide material;

performing a first halo implant to form conductively doped halo regions for an n-channel transistor;

performing a Source/Drain Extension (SDE) implant to form n-type conductive lightly doped drain regions for said n-channel transistor;

masking said n-channel transistor and exposing said portion of said P+ polysilicon layer that extends beyond said partial P+ polysilicon wordline;

etching said exposed portion of said P+ polysilicon layer to form a complete P+ polysilicon wordline profile comprising said P+ polysilicon layer, said second tungsten material, and said second oxide material;

performing a second halo implant to form conductively doped halo regions for an p-channel transistor.

10. The method as recited in claim 9, wherein said insitu dry etch step further comprises a $Cl_2$ and $CF_4$ etch chemistry to etch a tungsten silicide material.

11. The method as recited in claim 9, wherein said insitu dry etch step further comprises a $NF_3$ and $Cl_2$ etch chemistry to etch a tungsten nitride material or tungsten material.

12. The method as recited in claim 9, wherein said first halo implant step comprises an angled halo implant using boron impurities.

13. The method as recited in claim 12, wherein said boron impurities comprise Boron ($B_{11}$).

14. The method as recited in claim 12, wherein said first halo implant step comprises implanting with 30 keV boron ions to a dose of 2e12 ions/cm$^2$ at a tilt angle of 25° from four directions with a 90° rotation angle.

15. The method as recited in claim 9, wherein said Lightly Doped Drain (LDD) implant step comprises an implant using arsenic (As) impurities.

16. The method as recited in claim 15, wherein said Lightly Doped Drain (LDD) implant step comprises implanting with 15 keV arsenic ions to a dose of 5e13 ions/cm$^2$ at a tilt angle of 25° from four directions with a 90° rotation angle.

17. The method as recited in claim 9, wherein said masking of said N+ polysilicon layer under-laps said P+ polysilicon such that the entire substantially vertical edge of said P+ polysilicon is exposed prior to said step of etching P+ polysilicon layer.

18. The method as recited in claim 9, wherein said second halo implant step comprises an angled halo implant using phosphorus impurities.

19. The method as recited in claim 18, wherein said second halo implant step comprises implanting the substrate with 80 keV phosphorous ions to a dose of 2e12 ions/cm$^2$ at a tilt angle of 25° from four directions with a 90° rotation angle.

* * * * *